(12) United States Patent
Shabani et al.

(10) Patent No.: US 12,144,264 B2
(45) Date of Patent: Nov. 12, 2024

(54) SYSTEMS AND METHODS FOR QUBIT FABRICATION

(71) Applicant: NEW YORK UNIVERSITY, New York, NY (US)

(72) Inventors: Javad Shabani, Briarcliff Manor, NY (US); Kasra Sardashti, Brooklyn, NY (US)

(73) Assignee: New York University, New York, NY (US)

( * ) Notice: Subject to any disclaimer, the term of this patent is extended or adjusted under 35 U.S.C. 154(b) by 0 days.

(21) Appl. No.: 18/094,706

(22) Filed: Jan. 9, 2023

(65) Prior Publication Data

US 2023/0422635 A1    Dec. 28, 2023

Related U.S. Application Data

(63) Continuation of application No. 16/846,043, filed on Apr. 10, 2020, now Pat. No. 11,552,238.

(60) Provisional application No. 62/832,779, filed on Apr. 11, 2019.

(51) Int. Cl.
| | |
|---|---|
| *H10N 60/12* | (2023.01) |
| *G06N 10/00* | (2022.01) |
| *H10N 60/01* | (2023.01) |
| *H10N 60/10* | (2023.01) |
| *H10N 60/80* | (2023.01) |

(52) U.S. Cl.
CPC ............ *H10N 60/12* (2023.02); *G06N 10/00* (2019.01); *H10N 60/0884* (2023.02); *H10N 60/0912* (2023.02); *H10N 60/128* (2023.02); *H10N 60/805* (2023.02)

(58) Field of Classification Search
CPC .............. H10N 60/12; H10N 60/0884; H10N 60/0912; H10N 60/128; H10N 60/805
See application file for complete search history.

(56) References Cited

U.S. PATENT DOCUMENTS

| | | |
|---|---|---|
| 5,179,426 A | 1/1993 | Iwamatsu |
| 5,272,358 A | 12/1993 | Nishino et al. |
| 2020/0287119 A1 | 9/2020 | Black et al. |

FOREIGN PATENT DOCUMENTS

WO    WO-2021/185521 A1    9/2021

OTHER PUBLICATIONS

Bottcher, et al., "Superconducting, insulating and anomalous metallic regimes in a gated two-dimensional semiconductor-superconductor array," Nature Physics 14, pp. 1138-1144 (2018).
Herrmannsdorfer, et al., "Superconducting State in a Gallium-Doped Germanium Layer at Low Temperatures," Physical Review Letters 102(21), 217003, 4 pages(2009).
(Continued)

*Primary Examiner* — Matthew L Reames
(74) *Attorney, Agent, or Firm* — Foley & Lardner LLP

(57) ABSTRACT

A method of fabricating a superconducting-semiconducting stack includes cleaning a surface of a substrate, the substrate comprising a group IV element; depositing an insulating buffer layer onto the substrate, the insulating buffer layer comprising the group IV element; depositing a p-doped layer onto the insulating buffer layer; depositing a diffusion barrier onto the p-doped layer; and processing the superconducting-semiconducting stack through dopant activation.

12 Claims, 8 Drawing Sheets

(56) References Cited

OTHER PUBLICATIONS

Marcenat, et al., "Low-temperature transition to a superconducting phase in boron-doped silicon films grown on (001)-oriented silicon wafers," Physical Review B 81(2), 020501(R), 5 pages (2010).
Shabani, et al., "Gating of high-mobility InAs metamorphic heterostructures," Applied Physics Letters 105(26), pp. (2014).
Skrotzki, et al., "On-chip superconductivity via gallium overdoping of silicon," Applied Physics Letters 97(19), 192505, 3 pages (2010).
Takano, et al., "Superconducting properties of homoepitaxial CVD diamond," Diamond and Related Materials 16(4-7), pp. 911-914 (2007).
Wright & Kroemer, "Reduction of oxides on silicon by heating in a gallium molecular beam at 800C," Applied Physics Letters 36(3), 210 (1980).

SYSTEMS AND METHODS FOR QUBIT FABRICATION

CROSS-REFERENCE TO RELATED APPLICATION

The present application is a continuation of U.S. patent application Ser. No. 16/846,043, filed Apr. 10, 2020 (now U.S. Pat. No. 11,552,238), which claims the benefit of and priority to U.S. Provisional Patent App. No. 62/832,779 filed Apr. 11, 2019, the disclosures of which are hereby incorporated by reference in their entireties.

STATEMENT OF GOVERNMENT INTEREST

This invention was made with government support under contract no. FA9550-16-1-0348 awarded by the Air Force Office of Scientific Research. The government has certain rights in the invention.

TECHNICAL FIELD

The present disclosure generally relates to the field of quantum computing, and more specifically to systems and methods of qubit circuits.

BACKGROUND

In the field of quantum computing, superconducting quantum bits (qubits) form the basic unit of quantum information. Qubits can be formed of superconductor-insulator materials to produce a Josephson junction (JJ). Junctions with semiconductors as the weak-link resemble classical field-effect transistors and can be tuned via a gate voltage applied to the semiconductor. A hurdle in the performance of superconductor-semiconductor devices is the quality of the superconductor-semiconductor interfaces. Various defects at the superconductor-semiconductor interface and Schottky barriers can hinder the performance of qubit devices.

SUMMARY

According to an aspect of the present disclosure, a method of fabricating a superconducting-semiconducting stack includes cleaning a surface of a substrate, the substrate comprising a group IV element; depositing an insulating buffer layer onto the substrate, the insulating buffer layer comprising the group IV element; depositing a p-doped layer onto the insulating buffer layer; depositing a diffusion barrier onto the p-doped layer; and processing the superconducting-semiconducting stack through dopant activation.

In some embodiments, processing the superconducting-semiconducting stack through dopant activation includes rapid thermal annealing. In some embodiments, the method includes depositing a semi-insulating group IV capping layer onto the superconducting-semiconducting stack. In some embodiments, the method includes removing an oxide barrier from the superconducting-semiconducting stack and depositing a semi-insulating layer onto the superconducting-semiconducting stack. In some embodiments, the method includes forming one or more superconducting regions adjacent to the insulating buffer layer. In some embodiments, the method includes depositing contact metal leads onto the superconducting-semiconducting stack. In some embodiments, the method includes depositing a gate dielectric layer onto the superconducting-semiconducting stack and depositing a gate metal onto the gate dielectric layer. In some embodiments, the method includes etching the superconducting-semiconducting stack. In some embodiments, the method includes forming at least one of a lateral Josephson junction or a vertical Josephson junction from the superconducting-semiconducting stack.

According to an aspect of the present disclosure, a method of fabricating a superconducting-semiconducting stack includes cleaning a surface of a substrate, the substrate comprising a group IV element; depositing a diffusion barrier onto the substrate, the diffusion barrier comprising at least one of a pure element, an oxide, or a nitride; implanting at least one of group III or group IV ions into the substrate; and processing the superconducting-semiconducting stack through dopant activation.

In some embodiments, processing the superconducting-semiconducting stack through dopant activation includes rapid thermal annealing. In some embodiments, the method includes forming a lateral Josephson junction from the superconducting-semiconducting stack.

According to an aspect of the present disclosure, a device includes a substrate; a first superconducting region disposed on the substrate; a second superconducting region disposed on the substrate and separated by the first superconducting region by a p-doped region; a Josephson junction formed by the first superconducting region, the second superconducting region, and the p-doped region; and a gate electrode configured to electrostatically tune the Josephson junction.

In some embodiments, the Josephson junction is a lateral Josephson junction. In some embodiments, the Josephson junction is a vertical Josephson junction. In some embodiments, the substrate comprises a group IV element. In some embodiments, the device includes a first contact metal lead disposed on the first superconducting region and a second contact metal lead disposed on the second superconducting region. In some embodiments, the device includes a gate dielectric layer disposed on the contact metal leads and adjacent to the gate electrode. In some embodiments, the device includes a gate dielectric layer disposed adjacent to the first superconducting region and the second superconducting region. In some embodiments, the device includes an insulating buffer layer disposed on the substrate.

These and other features of various embodiments can be understood from a review of the following detailed description in conjunction with the accompanying drawings. It is to be understood that both the foregoing general description and the following detailed description are explanatory and are not restrictive of the present disclosure, as claimed.

DETAILED DESCRIPTION

The following detailed description and the appended drawings describe and illustrate various qubit device fabrication component systems and methods. The description and drawings are provided to enable one of skill in the art to make and use one or more qubit device fabrication systems and/or practice one or more methods. They are not intended to limit the scope of the claims in any manner.

Although superconductor-normal metal-superconductor (SNS) junctions composed of epitaxially-grown aluminum on semiconductor stacks of III-V materials (e.g., InAs and InGaAs) show promise, in particular in a gatemon configuration, integration of these III-V material systems into conventional complementary metal-oxide-semiconductor (CMOS) fabrication technologies suffer from process incompatibility with group IV materials. The presence of hetero-interfaces (interfaces between two unlike materials such as Al and GaAs) can result in fast decaying quantum states and unstable qubits.

The present solution provides systems and methods for SNS junctions comprised of all-group IV materials (e.g., silicon, germanium). Device and circuit fabrication methods for a gate-controlled qubit can include a bottom-up growth method or a top-down method. The device can include a base material for the circuit that is composed of silicon, reducing the defect densities for the qubit. Additionally, the systems and methods provided herein allow for room-temperature characterization of qubit circuits.

Figure 1:
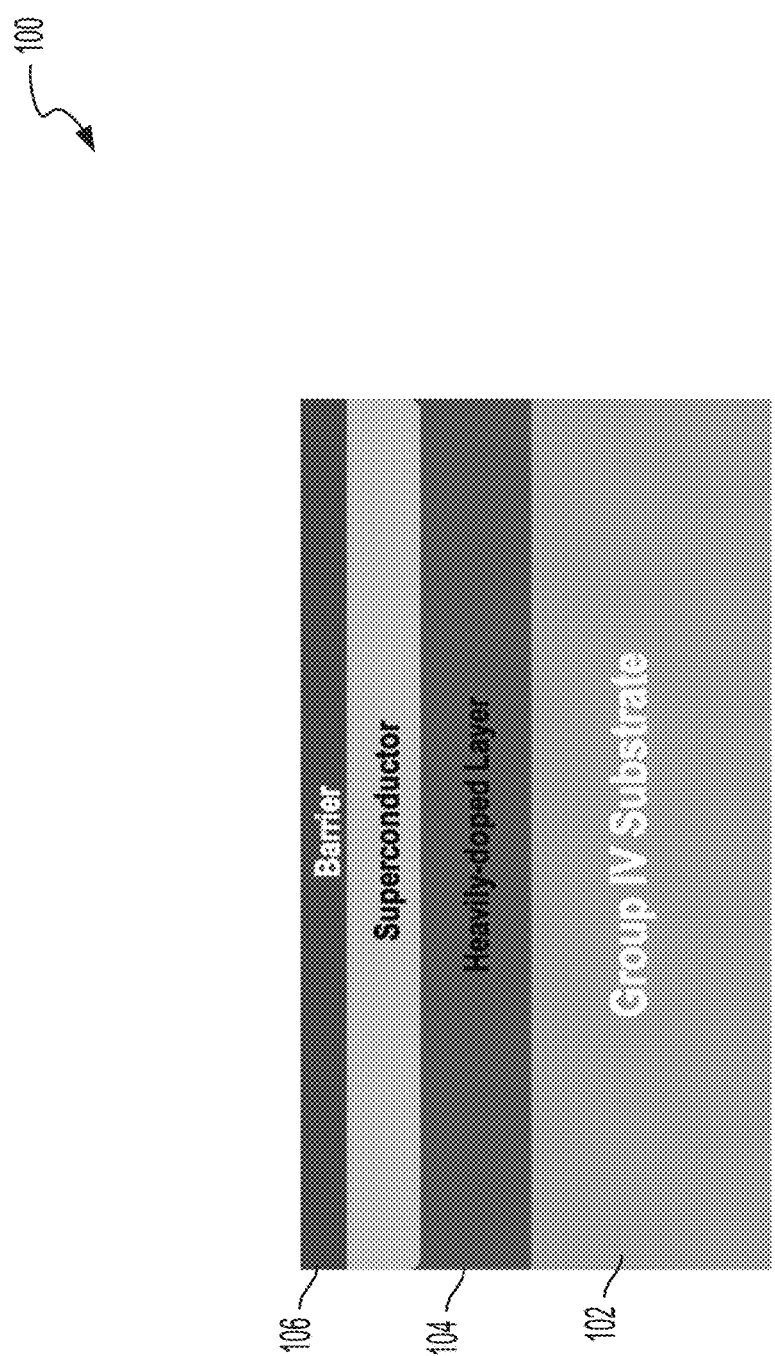
FIG. 1 illustrates a schematic diagram of a superconducting stack according to an embodiment.

FIG. 1 illustrates a schematic diagram of an embodiment of superconducting stack 100 (e.g, stack, superconducting-semiconducting stack, etc.). The superconducting stack 100 can be prepared using a top-down method with Ga⁺ ion implantation. The superconducting stack 100 can include a substrate 102. The substrate 102 can include a group IV element (e.g., Si, Ge, among others). In some embodiments, a portion of the substrate 102 can undergo ion implantation to form a p-doped layer 104.

The superconducting stack 100 can include a p-doped layer 104. The p-doped layer 104 can include acceptors (p-type dopant atoms) incorporated into a semiconductor material. For group IV semiconductors, acceptors can include group III elements (e.g. boron, aluminum, gallium, and indium). In contrast, donors for group IV semiconductors can include group V elements (e.g., phosphorus, arsenic, antimony, and bismuth). The p-doped layer 104 can include non-equilibrium incorporation of acceptors into a lattice of a group IV material. The p-doped layer can include a thin Ga-rich Si layer. In some embodiments, the p-doped layer 104 can be grown by a co-deposition method described herein.

The superconducting stack 100 can include a barrier 106. The barrier 106 can include an oxide or nitride of an element or semiconductor of the p-doped layer 104, such as the group IV element that is also present in the substrate 102, to form an oxide barrier. The barrier 106 can include a $SiO_2$ or $Si_3N_4$ thin films.

Figures 2A, 2B:
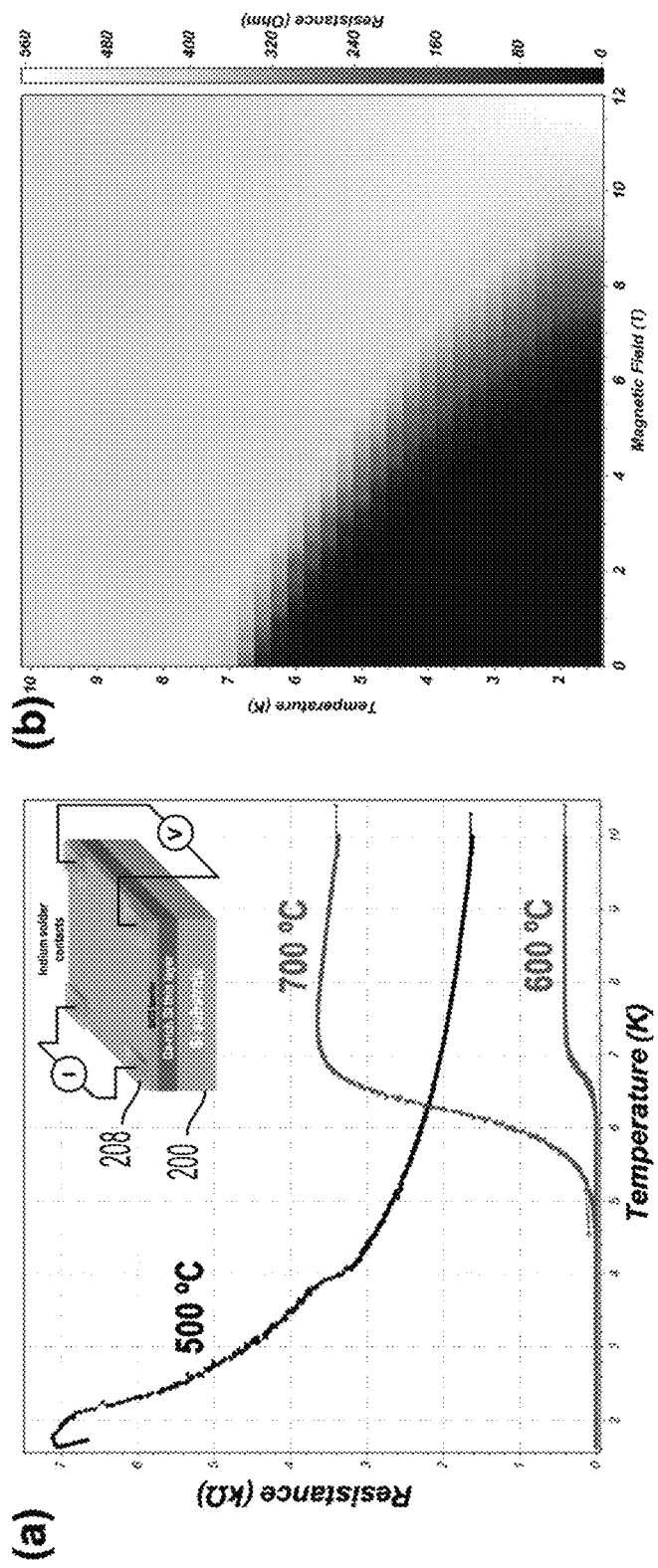
FIG. 2A illustrates resistance vs. temperature curves for a superconducting stack according to an embodiment.
FIG. 2B illustrates a contour map of temperature-magnetic field-resistance according to an embodiment.

FIG. 2A illustrates resistance vs. temperature curves for a stack 200. The stack 200 can be a superconducting stack 100. The stack 200 is prepared using a top-down method with Ga⁺ ion implantation according to an embodiment. The stack 200 can include a sample annealed at 500° C., a sample annealed at 600° C., and a sample annealed at 700° C. As shown in FIG. 2A, the superconducting phase is not observed for the sample annealed at 500° C. However, the superconducting phase is observed for the sample annealed at 600° C. and the sample annealed at 700° C. The critical temperature ($T_C$) prepared by the top-down method according to this embodiment range from 5.5 K to 7 K. The thickness and stability of the barrier 106 can determine the upper limit of the annealing temperature.

FIG. 2B illustrates a contour map of temperature-magnetic field-resistance for the sample annealed at 600° C. The contour map shows the perpendicular critical field ($H_C$) vs. temperature for the sample annealed at 600° C. The out-of-plane critical field follows a parabolic behavior with $B_C$ above 9 T. Non-equilibrium p-doping of Si can show properties of a robust superconducting layer with a $T_C$ above the temperature of liquid helium and large $B_C$.

The superconducting phase of a material is a state in which the material exhibits superconducting characteristics. Superconducting characteristics can include the expulsion of magnetic flux fields and zero electrical resistance when the material is cooled below a characteristic critical temperature ($T_C$). The presence of a superconducting phase within the superconducting stack 100 can be confirmed using 4-point probe resistivity measurements. The 4-point resistivity measurements can use solder contacts 208. In one embodiment, the solder contacts 208 are made of indium.

Figure 3:
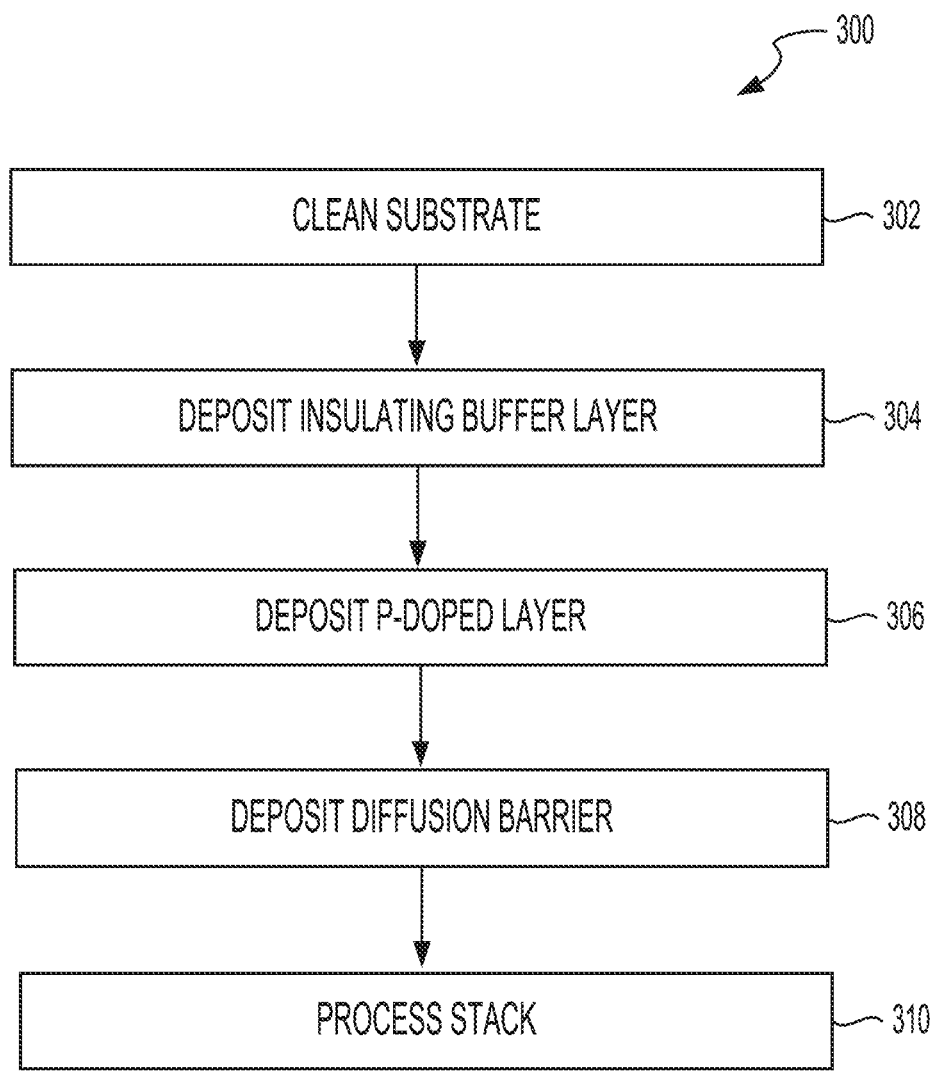
FIG. 3 illustrates a flow diagram for fabricating a superconducting stack according to an embodiment.

FIG. 3 illustrates a flow diagram of an example method 300 of fabricating a superconducting stack. The method 300 can include a bottom-up method for fabricating a superconducting stack 100. The bottom-up method can include achieving non-equilibrium p-doping via molecular beam epitaxy (MBE) growth. The method can include cleaning a surface of a substrate (BLOCK 302). The method can include depositing an insulating buffer layer onto the substrate (BLOCK 304). The method can include depositing a p-doped layer onto the insulating buffer layer (BLOCK 306). The method can include depositing a diffusion barrier onto the p-doped layer (BLOCK 308). The method can include processing the stack through dopant activation (BLOCK 310).

In further detail, the method 300 can include cleaning the surface of the substrate (BLOCK 302). The substrate 102 can include a group IV element (e.g., Si, Ge, among others). Cleaning the surface of the substrate 102 can include removing a native oxide from the surface of the substrate 102. For example, $SiO_2$ can be removed from a silicon substrate. $GeO_2$ can be removed from a germanium substrate. Cleaning the surface of the substrate 102 can include removing a capping layer intentionally deposited on the surface of the substrate 102. The process of cleaning the surface of the substrate 102 can include ex-situ methods or in-situ methods. Ex-situ methods can include using hydrofluoric acid (HF), buffer oxide etchant (BOE), among others. In-situ methods can include ion milling, atomic hydrogen cleaning, high-temperature desorption, oxygen gettering, among others. The process of cleaning the surface of the substrate 102 can include wet or dry etch methods. Wet etch methods can include methods that use liquid-phase etchants. Dry etch methods can include methods that use plasma-phase or gas-phase etchants.

The method 300 can include depositing an insulating buffer layer onto the substrate (BLOCK 304). The insulating buffer layer can include the same the group IV element as the substrate 102. The insulating buffer layer can be deposited onto the substrate 102 using MBE to achieve atomically sharp interfaces. The insulating buffer layer can be deposited onto the substrate 102 using MBE sources with ultrahigh-purity insulating group IV filaments. The insulating buffer layer can be deposited onto the substrate 102 at a rate of 0.5-1 nm/min. The insulating buffer layer can be deposited onto the substrate 102 subsequent to the surface cleaning 302 of the substrate 102. The stack can include an insulating buffer layer and the substrate 102.

The method 300 can include depositing a p-doped layer onto the insulating buffer layer (BLOCK 306). The p-doped layer 104 can be heavily doped, thereby exhibiting electrical conductivity similar to that of a metal. The p-doped layer 104 can be deposited by simultaneous dosing of a dopant (group III elements including B, Al, and Ga) and the group IV element. With the simultaneous dosing or co-deposition method, the dopant concentration can be tuned with a resolution on the order of 10s of parts per million. Depositing the p-doped layer 104 onto the insulating buffer layer can add a p-doped layer 104 to the stack. The stack can include a p-doped layer 104, an insulating buffer layer, and the substrate 102.

The method can include depositing a diffusion barrier onto the p-doped layer (BLOCK 308). The diffusion barrier can include an elemental material, a pure element, an oxide, a nitride, among others. The diffusion barrier can be deposited by chemical vapor deposition in-situ or ex-situ. The diffusion barrier can be deposited by physical vapor deposition in-situ or ex-situ. Depositing the diffusion barrier onto the p-doped layer 104 can add a diffusion barrier to the stack. The stack can include the diffusion barrier, the p-doped layer 104, the insulating buffer layer, and the substrate 102.

The method 300 can include processing the stack through dopant activation (BLOCK 310). Dopant activation can include rapid thermal annealing (RTA). Dopant activation can be achieved by subjecting the stack to RTA in an inert atmosphere (e.g., Ar, $N_2$). Dopant activation can be achieved under inert gas overpressure. Once the RTA process is completed, a first vertical semiconductor-superconductor junction within the stack is fabricated. The method can include forming one or more superconducting regions adjacent to the insulating buffer layer.

In some embodiments, the method 300 can include growing one or multiple stacks of semi-insulating and superconducting layers. The method 300 can include cleaning the surface of the substrate 102. Cleaning the surface of the substrate 102 can include removing a native oxide from the surface of the substrate 102. For example, $SiO_2$ can be removed from a silicon substrate. $GeO_2$ can be removed from a germanium substrate.

In some embodiments, the method 300 can include isolating a superconductor-normal metal-superconductor (SNS) junction from ambient electrostatic and electromagnetic interactions. The method 300 can include growing a semi-insulating capping layer on the junction. The semi-insulating capping layer can include a group IV element. The method 300 can include burying over the SNS junction with a semi-insulating group IV capping layer.

In some embodiments, the method 300 can create SNS junctions with lateral and vertical geometries. A single cycle of the bottom-up method 300 can create a stack for a lateral junction device. Two cycles of the bottom-up method 300 can create a stack for a vertical junction device. Depending on the number of cycles or iterations of the bottom-up method 300, the resulting device can include a lateral junction device or a vertical junction device.

Figure 4:
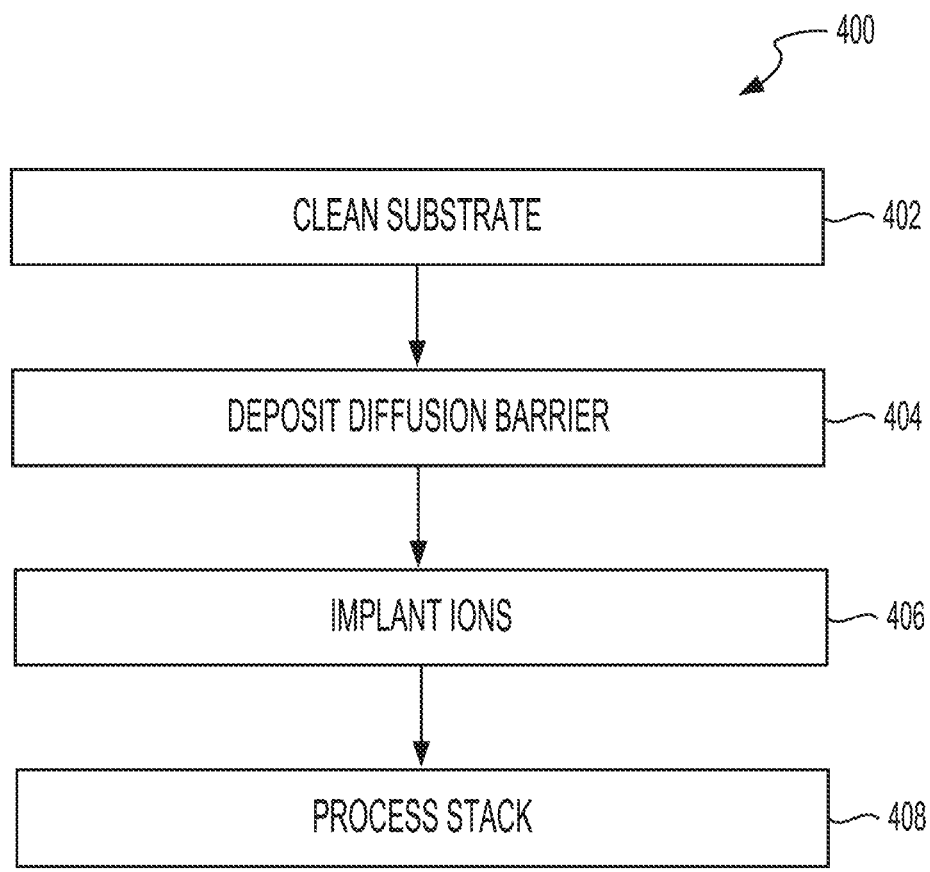
FIG. 4 illustrates a flow diagram for fabricating a superconducting stack according to an embodiment.

FIG. 4 illustrates a flow diagram of an example method 400 of fabricating a superconducting stack 100. The method 400 can include a top-down method for fabricating a superconducting stack 100. The top-down method can include achieving non-equilibrium p-doping via ion implantation. The method can include cleaning a surface of a substrate (BLOCK 402). The method can include depositing a diffusion barrier onto the substrate (BLOCK 404). The method can include implanting ions (BLOCK 406). The method can include processing the stack through dopant activation (BLOCK 408).

The method can include cleaning a surface of a substrate (BLOCK 402). The substrate 102 can include a group IV element (e.g., Si, Ge, among others). Cleaning the surface of the substrate 102 can include removing a native oxide from the surface of the substrate 102. For example, $SiO_2$ can be removed from a silicon substrate. $GeO_2$ can be removed from a germanium substrate. Cleaning the surface of the substrate 102 can include removing a capping layer intentionally deposited on the surface of the substrate 102. The process of cleaning the surface of the substrate 102 can include ex-situ methods or in-situ methods. Ex-situ methods can include using hydrofluoric acid (HF), buffer oxide etchant (BOE), among others. In-situ methods can include ion milling, atomic hydrogen cleaning, high-temperature desorption, oxygen gettering, among others. The process of cleaning the surface of the substrate 102 can include wet or dry etch methods. Wet etch methods can include methods that use liquid-phase etchants. Dry etch methods can include methods that use plasma-phase or gas-phase etchants.

The method can include depositing a diffusion barrier onto the substrate (BLOCK 404). The diffusion barrier can include an elemental material, a pure element, an oxide, a nitride, among others. The diffusion barrier can be deposited by chemical vapor deposition in-situ or ex-situ. The diffusion barrier can be deposited by physical vapor deposition in-situ or ex-situ. The stack can include the diffusion barrier and the substrate 102. The deposition of the diffusion barrier can be performed in a chamber that is used to perform the surface cleaning 402.

The method can include implanting ions (BLOCK 406). The ions can include ions derived from group III elements (e.g., $B^+$, $Al^+$, $Ga^+$, among others). The stack can undergo medium-energy ion implantation with high fluence (e.g., $10^{15}$-$10^{17}$ $cm^{-2}$) of the group III ions. The high fluence levels can correspond to a dopant incorporation of group III elements on the order of atomic percent.

The method can include processing the stack through dopant activation (BLOCK 408). Dopant activation can include rapid thermal annealing (RTA). Dopant activation can be achieved by subjecting the stack to RTA in an inert atmosphere (e.g., Ar, $N_2$). Dopant activation can be achieved under inert gas overpressure.

Figure 5:
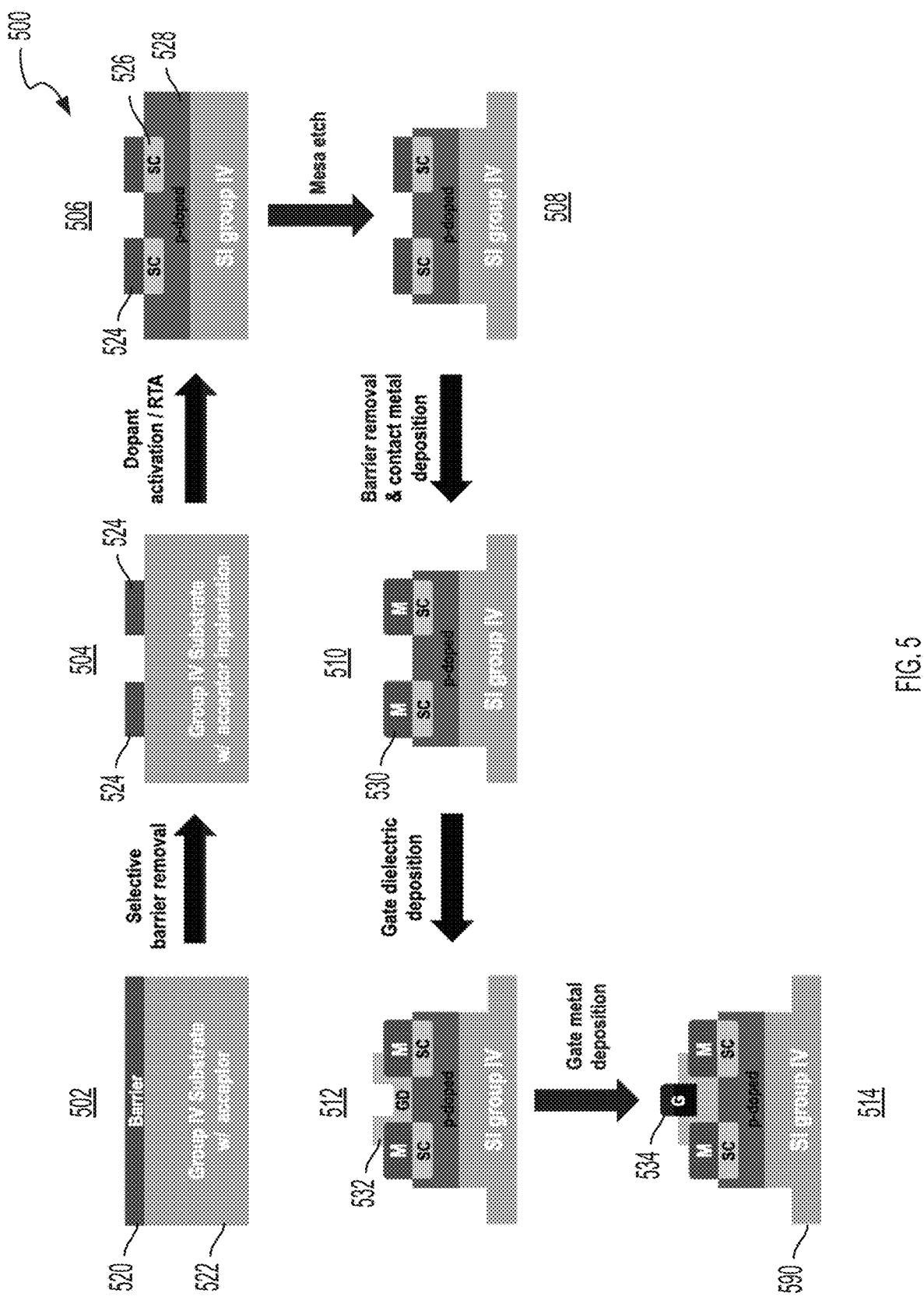
FIG. 5 illustrates a process flow diagram for a method of fabricating a lateral junction device according to an embodiment.

FIG. 5 illustrates a process flow diagram for a method of fabricating a lateral junction device 590 according to an embodiment. The method 500 can include providing a substrate with a group III acceptor ions or atoms (BLOCK 502). The method 500 can include selective barrier removal to produce a patterned barrier layer (BLOCK 504). The method 500 can include dopant activation to produce superconducting regions (BLOCK 506). The method 500 can include mesa etching to isolate the device (BLOCK 508). The method 500 can include barrier removal and contact metal deposition (BLOCK 510). The method 500 can include gate dielectric deposition (BLOCK 512). The method can include gate metal deposition (BLOCK 514).

The method 500 can include providing a substrate 522 with a group III acceptor ions or atoms (BLOCK 502). The substrate can include a group IV substrate with group III acceptor ions or atoms. The method 500 can include providing a substrate 522 that has group III acceptor ions or atoms incorporated within the substrate. The substrate can be coated with a barrier layer 520 (e.g., insulating buffer layer). The substrate 522 can be formed using a top-down method for fabricating a superconducting stack. The substrate 522 can be formed using a bottom-up method for fabricating a superconducting stack.

The method 500 can include selective barrier removal to produce a patterned barrier layer (BLOCK 504). The method 500 can include selective barrier removal to define the superconducting regions 526 and semiconducting regions 528 of the lateral junction device 590. The method can include selective etching of the barrier layer 520. Selective etching of the top barrier can include lithographically patterning the barrier layer 520 followed by a wet etch. Selective etching of the top barrier can include lithographically patterning the barrier layer 520 followed by a dry etch. The barrier layer 520 remaining on the substrate 522 after selective etching can form a patterned barrier layer 524.

The method 500 can include dopant activation to produce superconducting regions (BLOCK 506). Dopant activation can include rapid thermal annealing (RTA). Dopant activation can be achieved by subjecting the stack to RTA in an inert atmosphere (e.g., Ar, $N_2$). Dopant activation can be achieved under inert gas overpressure. After dopant activation is performed, regions underneath the patterned barrier layer 524 can become superconducting regions 526. Regions exposed or not underneath the patterned barrier layer 524 can be semiconducting regions 528. The semiconducting regions 528 can show behavior of a p-doped semiconductor. A Josephson junction with a semiconducting weak-link can be formed as a result of dopant activation. The method can include forming one or more superconducting regions adjacent to the insulating buffer layer. For example, the one or more superconducting regions can be formed under the barrier layer 524.

The method 500 can include mesa etching to isolate the device (BLOCK 508). Mesa etching can isolate the lateral junction device 590. Mesa etching can define a geometric profile of the lateral junction device 590.

The method 500 can include barrier removal and contact metal deposition (BLOCK 510). The method 500 can include complete removal of the patterned barrier layer 524. The method 500 can include selective metallization of superconducting regions 526. The metallization of superconducting regions 526 can form contact metal leads 530. The method can include depositing contact metal leads onto the superconducting-semiconducting stack.

The method 500 can include gate dielectric deposition (BLOCK 512). The method 500 can include depositing a gate dielectric layer 532 to achieve electrostatic gate tunability. The gate dielectric layer 532 can be deposited using chemical vapor deposition. The gate dielectric layer 532 can be deposited using atomic layer deposition. The deposition of the gate dielectric layer 532 can turn a Josephson junction to a gatemon or gate-controlled qubit. The gatemon can include a gate-tunable Josephson junction. The gatemon can include a variant of a transmon (transmission line shunted plasma oscillation qubit) that uses locally gated superconductor-semiconductor Josephson junctions for control of qubits.

The method 500 can include gate metal deposition (BLOCK 514). Gate metal 534 (e.g., gate electrode) deposition can include gate metallization. Gate metallization can be performed in the region between the contact metal leads 530. Gate metallization can produce the lateral junction device 590. The design of the lateral junction device 590 can be compatible with conventional planar complementary metal-oxide-semiconductor (CMOS) technologies.

The superconducting stack 100 can be a part of a device. The device can include a lateral junction device 590. The device can include a substrate 522. The device can include a first superconducting region disposed on the substrate 522. The device can include a second superconducting region disposed on the substrate 522 and separated by the first superconducting region by a p-doped region 528. The device can include a Josephson junction formed by the first superconducting region, the second superconducting region, and the p-doped region 528. The device can include a gate electrode configured to electrostatically tune the Josephson junction.

In some embodiments, the substrate can include a group IV element. In some embodiments, the Josephson junction is a lateral Josephson junction. In some embodiments, the device includes a first contact metal lead disposed on the first superconducting region and a second contact metal lead disposed on the second superconducting region. In some embodiments, the device includes a gate dielectric layer 532 disposed on the contact metal leads 530 and adjacent to the gate electrode 543.

Figure 6:
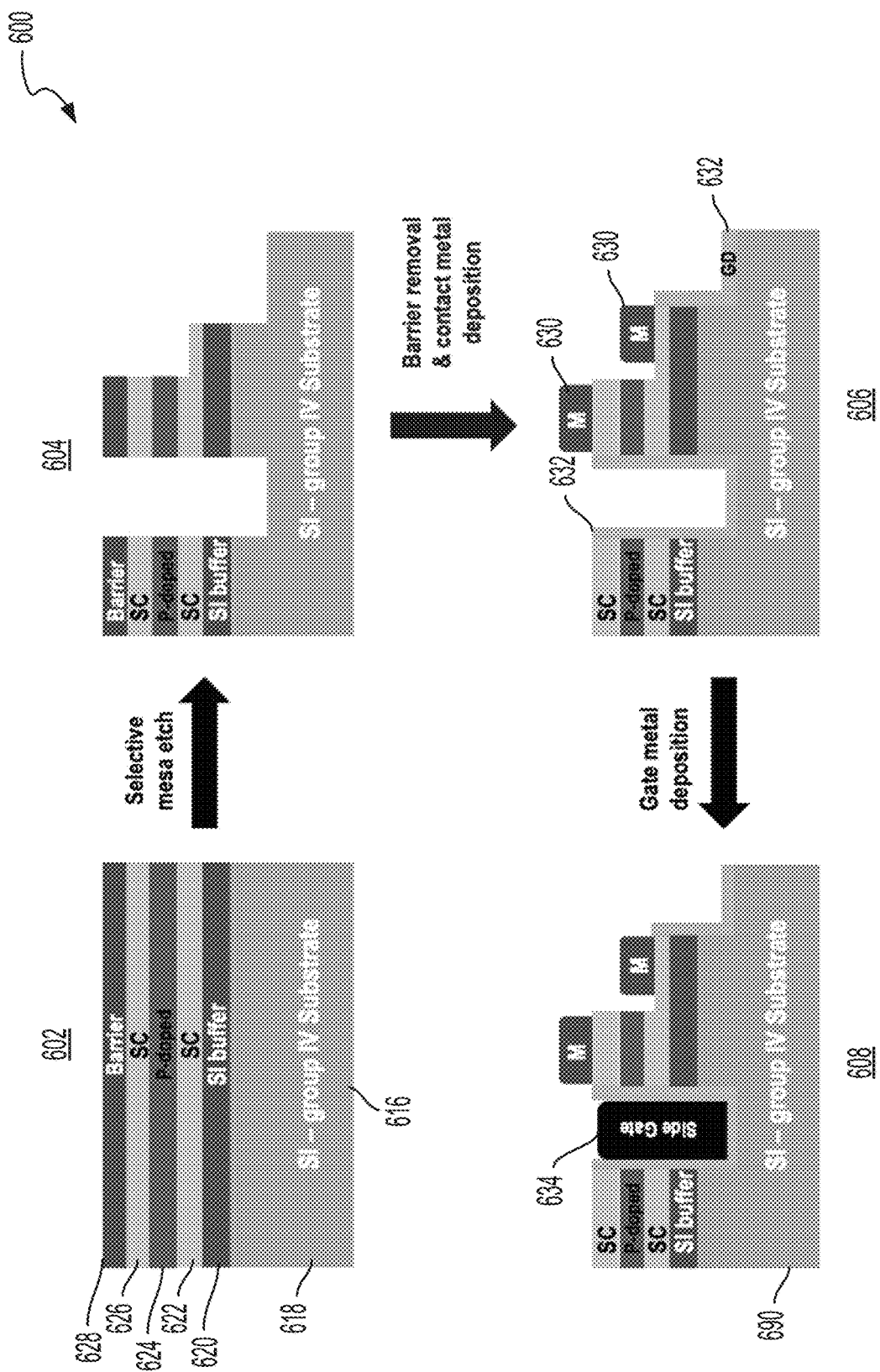
FIG. 6 illustrates a process flow diagram for a method of fabricating a vertical junction device according to an embodiment.

FIG. 6 illustrates a process flow diagram for a method of fabricating a vertical junction device according to an embodiment. The method 600 can include providing a stack that has undergone dopant annealing (BLOCK 602). The method 600 can include mesa etching to isolate the device (BLOCK 604). The method can include barrier removal and contact metal deposition (BLOCK 606). The method can include gate metal deposition (BLOCK 608).

The method 600 can include providing a stack that has undergone dopant annealing (BLOCK 602). The stack 616 can be formed using a bottom-up method for fabricating a superconducting stack. The stack 616 can be formed by at least two cycles of a bottom-up method for fabricating a superconducting stack. The stack can include a substrate 618. The substrate 618 can include a group IV substrate. The stack 616 can include an insulating buffer layer 620 on the substrate 618. The stack 616 can include a first superconducting layer 622 on the insulating buffer layer 620. The stack 616 can include a p-doped layer 624 on the first superconducting layer 622. The stack 616 can include a second superconducting layer 626 on the p-doped layer 624. The stack 616 can include a barrier layer 628 on the second superconducting layer 626.

The method 600 can include mesa etching to isolate the device (BLOCK 604). Mesa etching can isolate the vertical junction device 690. Mesa etching can define a geometric profile of the vertical junction device 690. The method 600 can include a two-step etch. The two-step etch can be a dry etch or a wet etch. The two-step etch can include a deep etch that goes through the layers grown using the bottom-up method. The deep etch can go through the insulating buffer layer 620 and a portion of the substrate 618. The two-step etch can include a shallow etch that only reaches the first superconducting layer 622. The shallow etch can give access to the first superconducting layer 622 for electrical or metal contacts.

The method 600 can include barrier removal and contact metal deposition (BLOCK 606). The method 600 can include complete removal of the barrier layer 628. The method 600 can include selective metallization of the first superconducting layer 622. The method 600 can include selective metallization of the second superconducting layer 626. The metallization of the first superconducting layer 622 can form contact metal leads 630 on the first superconducting layer 622. The metallization of the second superconducting layer 626 can form contact metal leads 630 on the second superconducting layer 626. The method 600 can include depositing a gate dielectric layer 632 to achieve electrostatic gate tunability. The gate dielectric layer 632 can be deposited using atomic layer deposition. The deposition of the gate dielectric layer 632 can turn the Josephson junction to a gatemon or gate-controlled qubit. The gatemon can include a gate-tunable Josephson junction. The gatemon can include a variant of a transmon (transmission line shunted plasma oscillation qubit) that uses locally gated superconductor-semiconductor Josephson junctions for control of qubits.

The method 600 can include gate metal deposition (BLOCK 608). Gate metal 634 deposition can include gate metallization. Gate metallization can produce the vertical junction device 690. The design of the vertical junction device 690 can allow for precise definition of the active junction area whose electrostatic geometry can be modified by the geometry achieved with mesa etching. The vertical junction device 690 could include gate-all-around geometries for electrostatic gating of the Josephson junctions.

The superconducting stack 100 can be a part of a device. The device can include a substrate 618. The device can include a first superconducting region disposed on the substrate 618. The device can include a second superconducting region disposed on the substrate 618 and separated by the first superconducting region by a p-doped region 624. The device can include a Josephson junction formed by the first superconducting region, the second superconducting region, and the p-doped region 624. The device can include a gate electrode configured to electrostatically tune the Josephson junction.

In some embodiments, the substrate can include a group IV element. In some embodiments, the Josephson junction is a vertical Josephson junction. In some embodiments, the device includes a first contact metal lead disposed on the first superconducting region and a second contact metal lead disposed on the second superconducting region. In some embodiments, the device includes a gate dielectric layer 632 disposed adjacent to the first superconducting region and the second superconducting region. In some embodiments, the device includes an insulating buffer layer 620 disposed on the substrate.

Figure 7:
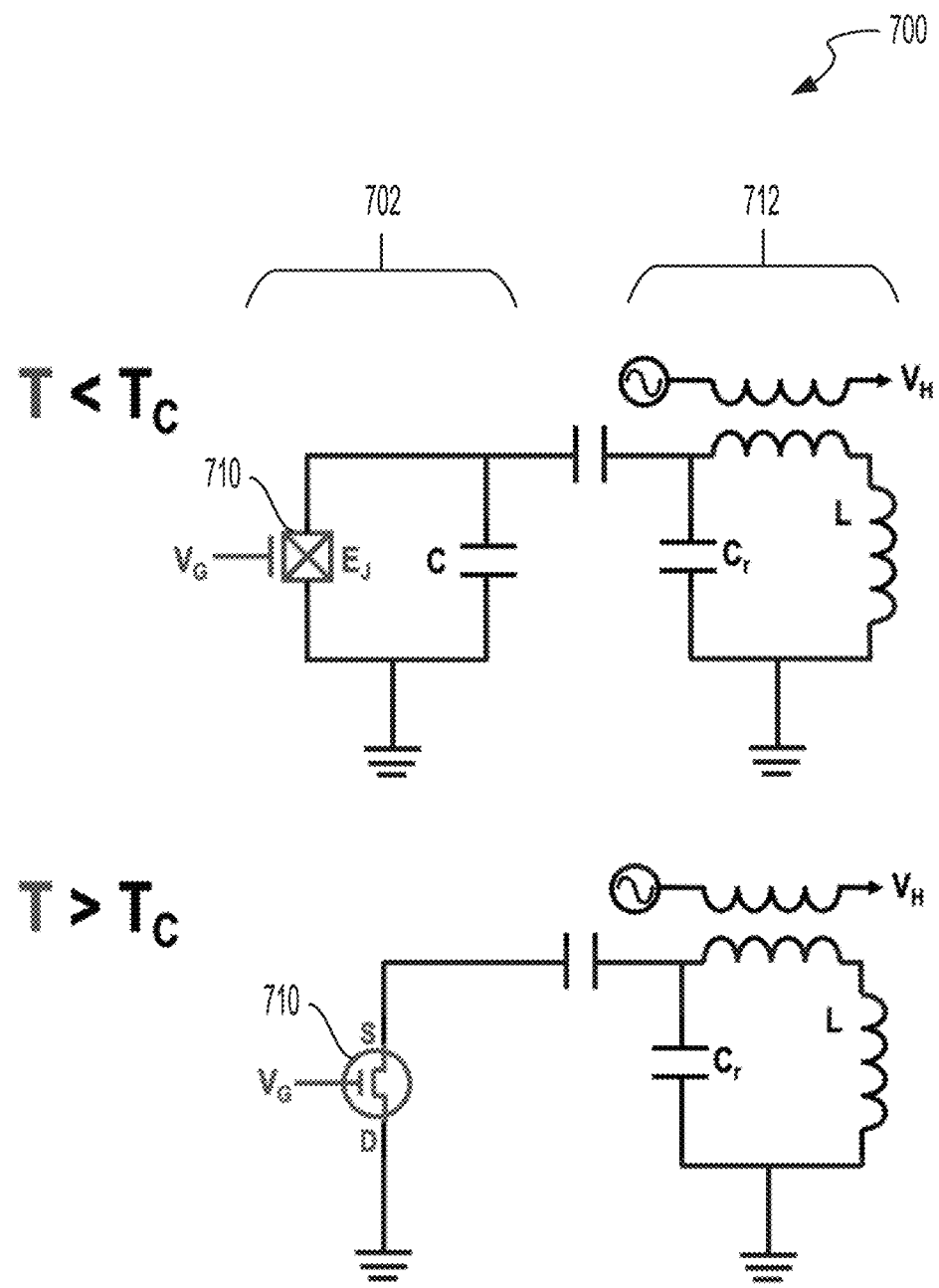
FIG. 7 illustrates a schematic diagram of a circuit with a transmon component and a radio frequency transmission line according to an embodiment.

FIG. 7 illustrates a schematic diagram of a circuit 700 with a transmon component 702 and radio-frequency (RF) transmission line 712. At a temperature $T<T_C$, the device 710 acts as a gatemon qubit. At a temperature $T>T_C$, the device 710 acts as a field-effect transistor (FET). For the device 710, a transition from FET to gatemon occurs at a critical temperature, $T_C$. At a temperature $T>T_C$, performance of the device can be evaluated and benchmarked. At a temperature $T>T_C$, the device 710 can operate as a conventional transistor suitable for executing tests on the performance and connectivity of the circuits. At a temperature $T>T_C$, the device 710 can operate as a conventional transistor for executing tests on the coupling behavior of the device 710 with the RF transmission line 712 or RF circuitry.

Figure 8:
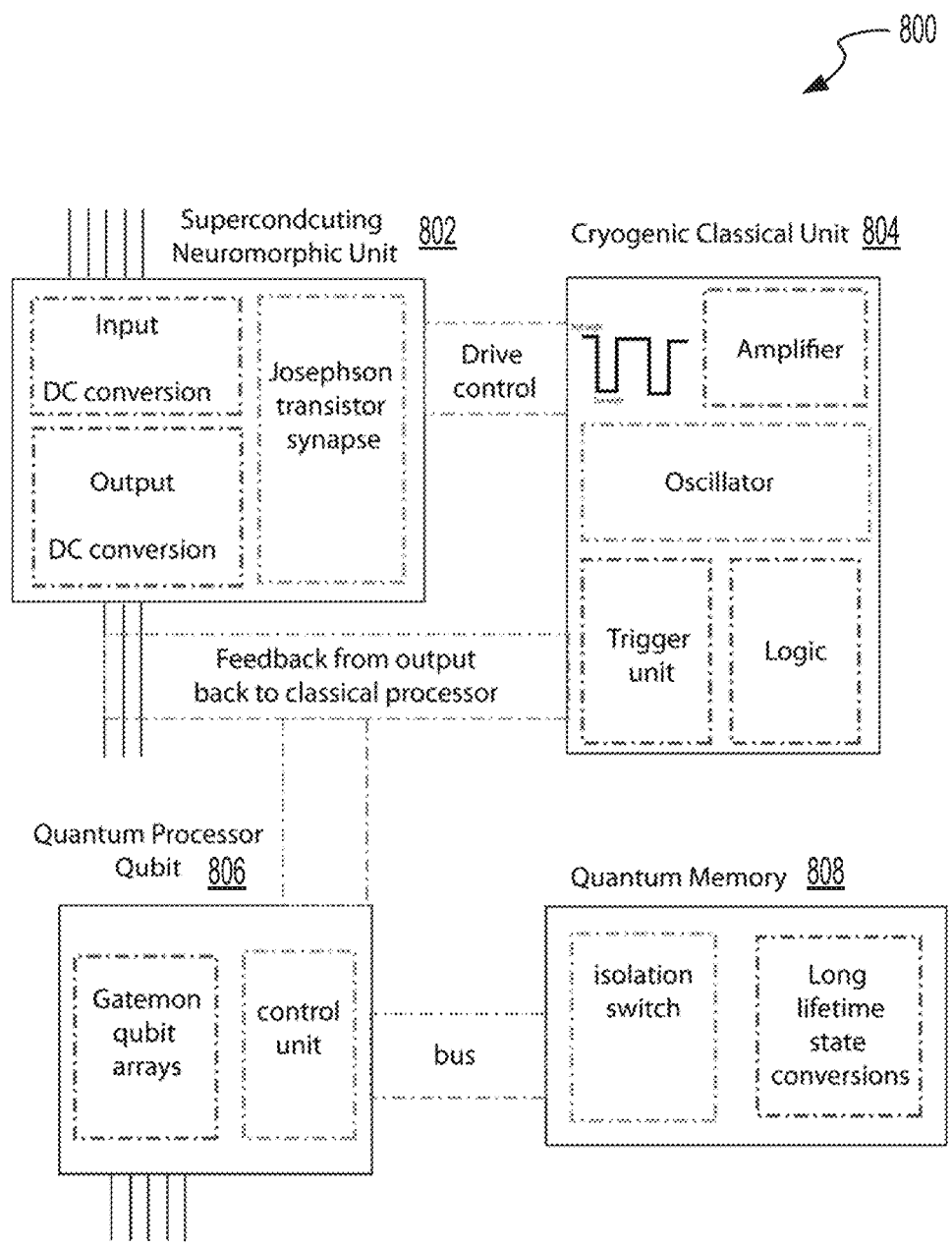
FIG. 8 illustrates a schematic diagram of a computer chip with quantum and classical processing units according to an embodiment.

FIG. 8 illustrates a schematic diagram of a computer chip 800 with quantum and classical processing units. The computer chip 800 can operate at room temperature and low temperatures. The computer chip can include qubits in a transistor mode that can be characterized at room-temperature. Characterizing the qubits at room temperature can allow for benchmarking from room-temperature performance to low-temperature qubit operation. The computer chip 800 includes a superconducting neuromorphic unit 802, a cryogenic classical unit 804, a quantum processor qubit 806 and a quantum memory 808. The cryogenic classical unit 804 (in cryogenic mode) can operate alongside the superconducting neuromorphic unit 802, the quantum processor qubit 806 and the quantum memory 808.

As utilized herein, the terms "approximately," "about," "substantially", and similar terms are intended to have a broad meaning in harmony with the common and accepted usage by those of ordinary skill in the art to which the subject matter of this disclosure pertains. It should be understood by those of skill in the art who review this disclosure that these terms are intended to allow a description of certain features described and claimed without restricting the scope of these features to the precise numerical ranges provided. Accordingly, these terms should be interpreted as indicating that insubstantial or inconsequential modifications or alterations of the subject matter described and claimed are considered to be within the scope of the disclosure as recited in the appended claims.

It should be noted that the term "exemplary" and variations thereof, as used herein to describe various embodiments, are intended to indicate that such embodiments are possible examples, representations, or illustrations of possible embodiments (and such terms are not intended to connote that such embodiments are necessarily extraordinary or superlative examples).

The term "coupled" and variations thereof, as used herein, means the joining of two members directly or indirectly to one another. Such joining may be stationary (e.g., permanent or fixed) or moveable (e.g., removable or releasable). Such joining may be achieved with the two members coupled directly to each other, with the two members coupled to each other using a separate intervening member and any additional intermediate members coupled with one another, or with the two members coupled to each other using an intervening member that is integrally formed as a single unitary body with one of the two members. If "coupled" or variations thereof are modified by an additional term (e.g., directly coupled), the generic definition of "coupled" provided above is modified by the plain language meaning of the additional term (e.g., "directly coupled" means the joining of two members without any separate intervening member), resulting in a narrower definition than the generic definition of "coupled" provided above.

The term "or," as used herein, is used in its inclusive sense (and not in its exclusive sense) so that when used to connect a list of elements, the term "or" means one, some, or all of the elements in the list. Conjunctive language such as the phrase "at least one of X, Y, and Z," unless specifically stated otherwise, is understood to convey that an element may be either X, Y, Z; X and Y; X and Z; Y and Z; or X, Y, and Z (i.e., any combination of X, Y, and Z). Thus, such conjunctive language is not generally intended to imply that certain embodiments require at least one of X, at least one of Y, and at least one of Z to each be present, unless otherwise indicated.

References herein to the positions of elements (e.g., "top," "bottom," "above," "below") are merely used to describe the orientation of various elements in the FIGURES. It should be noted that the orientation of various elements may differ according to other exemplary embodiments, and that such variations are intended to be encompassed by the present disclosure.

What is claimed is:

1. A method, comprising:
   cleaning a surface of a substrate, the substrate comprising a group IV element; and
   forming a superconducting-semiconducting stack by:
   depositing an insulating buffer layer onto the substrate, the insulating buffer layer comprising the group IV element;
   depositing a p-doped layer onto the insulating buffer layer;
   depositing a diffusion barrier onto the p-doped layer; and
   annealing the substrate, insulating buffer layer, p-doped layer, and the diffusion barrier to form (1) a first superconducting layer between the insulating buffer layer and the p-doped layer and (2) a second superconducting layer between the p-doped layer and the diffusion barrier.

2. The method of claim 1, further comprising:
   depositing a semi-insulating group IV capping layer onto the superconducting-semiconducting stack.

3. The method of claim 1, further comprising:
   removing an oxide barrier from the superconducting-semiconducting stack; and
   depositing a semi-insulating layer onto the superconducting-semiconducting stack.

4. The method of claim 1, further comprising:
   depositing contact metal leads onto the superconducting-semiconducting stack.

5. The method of claim 1, further comprising:
   depositing a gate dielectric layer onto the superconducting-semiconducting stack; and
   depositing a gate metal onto the gate dielectric layer.

6. The method of claim 1, further comprising:
   etching the superconducting-semiconducting stack.

7. The method of claim 1, further comprising:
   forming at least one of a lateral Josephson junction or a vertical Josephson junction from the superconducting-semiconducting stack.

8. A method, comprising:
   cleaning a surface of a substrate, the substrate comprising a group IV element; and
   forming a superconducting-semiconducting stack by:
   depositing a diffusion barrier onto the substrate, the diffusion barrier comprising at least one of a pure element, an oxide, or a nitride;
   removing a first portion of the diffusion barrier to form a second portion of the diffusion barrier and a third portion of the diffusion barrier;
   implanting at least one of group III or group IV ions into the substrate; and
   annealing the substrate and diffusion barrier to form (1) a first superconducting region between the second portion of the diffusion barrier and the p-doped layer and (2) a second superconducting region between the third portion of the diffusion barrier and the p-doped layer.

9. The method of claim 8, further comprising:
   forming a lateral Josephson junction from the superconducting-semiconducting stack.

10. The method of claim 8, further comprising:
    depositing a first metal lead onto the second portion of the diffusion barrier layer; and
    depositing a second metal lead onto the third portion of the diffusion barrier layer.

11. The method of claim 10, further comprising:
    depositing a gate dielectric layer onto the first metal lead, the second metal lead, and the p-doped layer; and
    depositing a gate metal onto the gate dielectric layer.

12. The method of claim 8, further comprising:
    etching the superconducting-semiconducting stack.

* * * * *